(12) United States Patent  
Nilsson et al.

(10) Patent No.: US 6,959,063 B1  
(45) Date of Patent: Oct. 25, 2005

(54) FRACTIONAL-N PHASE LOCKED LOOP

(75) Inventors: Leif Magnus Andre Nilsson, Lund (SE); Hans Lennart Hagberg, Malmö (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 879 days.

(21) Appl. No.: 09/580,119

(22) Filed: May 30, 2000

Related U.S. Application Data

(60) Provisional application No. 60/185,681, filed on Feb. 29, 2000.

(51) Int. Cl.[7] ............................................... H03D 3/24
(52) U.S. Cl. ........................ 375/376; 375/371; 375/373; 375/375
(58) Field of Search ............................... 375/371–376; 327/2, 152, 12, 3, 23; 331/1 A, 25, 11

(56) References Cited

U.S. PATENT DOCUMENTS

| | | | | |
|---|---|---|---|---|
| 5,710,526 A | * | 1/1998 | Nauta et al. ................... | 331/25 |
| 5,729,179 A | * | 3/1998 | Sumi ............................ | 331/12 |
| 6,198,355 B1 | * | 3/2001 | Lindquist et al. ............. | 331/27 |

FOREIGN PATENT DOCUMENTS

| | | |
|---|---|---|
| EP | 0 766 403 A1 | 4/1997 |
| WO | WO99/48195 | 9/1999 |

* cited by examiner

Primary Examiner—Stephen Chin  
Assistant Examiner—Curtis Odom  
(74) Attorney, Agent, or Firm—Potomac Patent Group PLLC

(57) ABSTRACT

A phase-locked loop has a phase detector that generates a phase difference signal, a circuit that generates a phase-locked loop output signal having a frequency that is a function of the phase difference signal, a frequency divider that receives the phase-locked loop output signal and generates therefrom a divided frequency signal. To substantially reduce variation in the duty cycle of the divided frequency signal, a comparison signal having one half the frequency of the divided frequency signal is generated. This may be performed by configuring a latch to toggle its output state once for every cycle of the divided frequency signal. To compensate for the additional division by two in the feedback path, the phase detector may use a dual-edge triggered latch to generate the phase difference signal so that it represents a phase difference between the reference signal and a signal having twice the frequency of the comparison signal.

26 Claims, 8 Drawing Sheets

FRACTIONAL-N PHASE LOCKED LOOP

CROSS REFERENCE TO RELATED APPLICATIONS

This application claims the benefit of U.S. Provisional Application No. 60/185,681 filed Feb. 29, 2000.

BACKGROUND

The invention relates to fractional-N phase locked loops, and more particularly to improving the duty cycle at a frequency divider output in a phase locked loop.

Fractional-N phase locked loops (PLLs) are well known. For example, sigma-delta controlled fractional-N PLL modulators may be used in radio communication systems for generating local oscillator frequencies, with the ability to quickly jump from one operating frequency to another. The fractional-N property permits the use of a high compare frequency while still generating local oscillator frequencies in-between constant multiples of the reference frequency. By controlling the divider ratio with the sigma delta modulator, modulation having a constant envelope can be generated. By using these properties of the fractional-N phase locked loop, radio architectures for constant envelops systems can be developed that are compact enough to enable a complete radio to be integrated on a single applications specific integrated circuit (ASIC).

A block diagram of a prior art sigma-delta controlled fractional-N PLL modulator is depicted in FIG. 1. A reference signal 101 is fed to a phase detector 102 together with the phase of the output of a frequency divider 106. The reference signal 101 is preferably a sinusoidal signal having a frequency denoted by $f_{ref}$. The output of the phase detector 102 is a pulse that is related to the phase difference between the reference signal 101 and the output of the frequency divider 106. The output of the phase detector 102 is fed to a charge pump 107 and then filtered by a loop filter 108. The output of the loop filter 108 is then applied to a voltage controlled oscillator (VCO) 109. The output signal of the VCO 109 is supplied to the input of the frequency divider 106. As a result of this feedback arrangement, the output frequency of the VCO 105 is driven to equal the frequency of the reference signal 101 times the division factor of the frequency divider 106. Hence, the frequency of the VCO 109 can be controlled by controlling the division factor of the frequency divider 106. In a sigma-delta controlled fractional-N PLL modulator, the division factors are generated by a sigma-delta modulator 110, whose input receives a modulating signal 111.

The frequency divider 106 in the PLL has to fulfill three important requirements in order to achieve the desired modulation. First, it must be able to change the division factor once every reference frequency cycle. Second, it must introduce exactly equal delay for all division factors, in order to avoid extra nonlinearities in the loop. Third, it must be able to accomplish a wide range of consecutive division factors in order to make the sigma-delta controlled fractional-N PLL modulator work at a wide range of radio frequencies, and thereby accomplish the multi-band functionality.

To satisfy these requirements, the frequency divider 106 may be implemented in the form of a plurality of series-connected divider blocks, as illustrated in FIG. 2 and described in U.S. Pat. No. 5,948,046, which is hereby incorporated herein by reference in its entirety. Two types of divider blocks are utilized. A first type is any one of the non-presettable ⅔-divider blocks 200a, 200b, 200c, 200d (henceforth referred to generally by the reference number 200). A ⅔-divider block 200 divides the clock input frequency 210a, 210b, 210c, 210d, 210e, 210f, 210g (henceforth referred to generally by the reference number 210) by 2 or 3, depending on the logical values of a first input control signal 211a, 211b, 211c, 211d, 211e (henceforth referred to generally by the reference number 211) and of a corresponding one of a group of second input control signals 207. In some embodiments, the clock inputs 210 may be in the form of differential signals, but this need not be the case in all embodiments. When configured in series with other ⅔-divider blocks 300, first input control signal 211 is generally supplied by a more significant neighboring ⅔ divider block 200. One of these first control signals 211 (e.g., the first control signal 211c) also serves as the output, $f_{FREQ.\ DIV.}$, from the frequency divider 106.

When used in a continuous phase modulator, such as the one depicted in FIG. 1, the second input control signals 207 are generally derived from the output of the ΣΔ modulator 110. The second input control signals 207 are used to indicate whether division by two (second control signal=0) or by three (second control signal=1) is requested. However, in order for division by three to be performed, the second control signal 211 must also be set to one. In this sense, the second control signal 211 may be considered a "swallow enable" signal (division by three in the ⅔-divider block 200 is performed by "swallowing" an extra clock cycle in addition to those normally swallowed for division by two).

The multi-divide frequency divider 106 further includes a second type of divider block, herein referred to as a presettable divider block 201a, 201b (henceforth referred to generally by the reference number 201). In the exemplary multi-divide frequency divider of FIG. 2, two presettable divider blocks 201a and 201b, are utilized in the most significant positions of the divider block chain (where the chain comprises both presettable and conventional divider blocks, 201 and 200). The presettable divider block 201 includes the same functionality as the conventional ⅔-divider block 200, and in addition, includes the ability to preset its internal state. Control of the preset option is by means of the On/off signals 208, coordinated with the second control signals 207.

This preset capability is very important for the complete implementation of the multi-divide frequency divider 106, because it provides an opportunity to switch the ⅔-divider block 201, which works like a state machine, on and off into the correct initial state. By doing this, one is able to increase and decrease the possible division factor range of the complete frequency divider 106 at any time during operation. That is, the frequency divider 106 will immediately (within the correct reference cycle) start to divide by the new division factor regardless of whether the wanted division factor is present in the decreased or expanded region. As used here, the term "decreased region" refers to those division factors that are obtainable when none of the presettable divider blocks 201 is enabled. In the exemplary embodiment, the decreased region would be division factors in the range from 16 to 31. As used here, the term "expanded region" refers to those division factors that are obtainable when one or more of the presettable divider blocks 201 is enabled in a divider block chain. In the exemplary embodiment, the expanded region would be division factors in the range from 32 to 63 (when only a first of the presettable divider blocks 201 is active) and from 64 to 95 (when both of the presettable divider blocks 201 is active). It is further noted that in the exemplary embodiment, the divider block 201b, which occupies the most significant position in the string of divider blocks 200, 201, is illustrated as only dividing by "2". This is accomplished by hard-wiring its second control signal input to always cause a division by "2" to occur. For this reason, it is not illustrated as receiving a second control signal 207.

When using a frequency divider 106 built out of ⅔ divider blocks 200, 201, as shown in FIG. 2, the duty cycle of the frequency divider output signals varies with different input frequencies and divider ratios. For the arrangement depicted in FIG. 2, the frequency divider output duty cycle can be expressed as:

$$\frac{(N/8 - \text{Int}(N/8)) * 8}{f_{REF}(N + 16)}$$

where N denotes the applied integer division factor produced by the modulation block 213. The value "8" that is used in the formula derives from the fact that in the example of FIG. 2, the output signal 211c is supplied by the fourth ⅔ divider block 200d. Had the output signal instead been generated by the third ⅔ divider block 200c, the number "8" would have been replaced by the number "4" in the formula; and, if the output signal instead had instead been generated by the second ⅔ divider block 200b, the number "8" would have been replaced by the number "2" in the formula.

Furthermore, the number "16" in the formula represents the minimum division factor that it is possible to use in a ⅔ divider chain in which 4 blocks are active (i.e., with all blocks set to divide by 2). If only 3 divider blocks were implemented in a ⅔ divider chain, the number "16" would be replaced by the number "8", and so on.

Ideally, the varying duty cycle should not influence the phase detector 102, but there is always some dependency. For example, consider the dead-band-free phase detector/charge pump combination 300 shown in FIG. 3. The use of first and second digital latches 301, 303 enables multiple states (not shown in FIG. 3) and, hence, an extended range of the phase detector/charge pump combination 300. In operation, the first latch 301 controls whether a first charge pump 305 is on or off. Similarly, the second latch 303 controls whether the second charge pump 307 is on or off. The first and second charge pumps 305, 307 are connected in series, with the phase detector/charge pump output current, $i_{out}$, being supplied at the connection point between the two charge pumps. The amount of phase detector/charge pump output current, $i_{out}$, is related to whether none, one, or both of the first and second charge pumps 305, 307 are turned on. The amount of time that $i_{out}$ is non-zero is a function of the phase difference between the two input signals, $f_{ref}$ and $f_{FREQ.\ DIV}$. Each of these signals is supplied to a clock input of a respective one of the first and second latches 301, 303. The first of these signals to present a clocking edge causes the output of the corresponding latch to be asserted, which in turn, causes a corresponding one of the first and second charge pumps 305, 307 to turn on. When the clocking edge of the remaining input signal is subsequently asserted, it too causes the output of its corresponding latch to be asserted. The outputs of both the first and second latches 301, 303 are further supplied to respective inputs of a logical AND gate 309, whose output is supplied to the input of a delay circuit 311, which delays the signal by an amount ΔT before supplying it to the RESET inputs of both the first and second latches 301, 303. Consequently, when the outputs of both latches 301, 303 are asserted, the output of the AND gate 309 will be asserted as well, thereby resetting both latches 301, 303 after a period of delay, ΔT. They are now initialized to repeat the process again for a next cycle. As a result, the output current $i_{out}$ is either a positive value (being supplied by the first charge pump 305) if the first input signal $f_{ref}$ leads the second input signal $f_{FREQ.\ DIV}$, or else it is a negative value (being drawn by the second charge pump 307) if the second input signal $f_{FREQ.\ DIV}$ leads the first input signal $f_{ref}$.

The reason for the presence of the delay circuit 311 is to eliminate a dead-band that would otherwise characterize the transfer function of the phase detector. The dead-band would result because, when the PLL is properly tracking its reference, $f_{ref}$, both of the phase-detector latches 301, 303 trigger almost simultaneously, due to the fact that the phase difference between the two input signals becomes very small. If there were no delay circuit 311, the reset signal would immediately reset the first and second latches 301, 303 and, as a consequence, only short spikes would appear at the latch outputs, too fast to turn on the respective first and second charge pumps 305, 307. In fact, even if there were a small phase error (i.e., a tracking error), the first and second latches 301, 303 would reset too fast for the charge pumps 305, 307 to react if there were no delay circuit 311 present. Consequently, the phase-detector transfer function would be characterized by a small dead-band (low-gain region) around the origin. With the extra delay provided by the delay circuit 311, the up and down pulses are each long enough to activate the charge pumps 305, 307, thereby eliminating the dead-band.

Returning now to the discussion of how the varying duty cycle of the frequency divider output signal can influence phase detector performance, when the reset pulse of the phase/frequency detector rises, there is a delay until the charge pumps 305, 307 are turned off. This delay, $\Delta T_{reset}$, is illustrated in the timing diagrams depicted in FIG. 4. Depending on whether the frequency divider output signal (denoted $f_{FREQ.\ DIV}$) is high or not when the reset pulse comes, this delay varies. The reason for this is because imperfections that inevitably result when the circuit is implemented in silicon cause the delay through the first and second latches 301, 303 to vary as a function of whether the clock input is high or low. Now, the duty cycle of the frequency divider output signal varies randomly (i.e., it is sometimes high and sometimes low when the reset pulse in the phase detector is generated), which causes random current pulses in the loop filter 108. The current pulses increase the noise level of the complete phase locked loop.

It is therefore desirable to provide techniques and apparatuses that are useful for reducing the influence that the varying duty cycle of the frequency divider output signal has on the performance of the phase detector.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in a phase detector that comprises a first input that receives a reference clock signal; a second input that receives a comparison signal; and a comparison circuit that compares a phase of the reference clock signal with a phase of a signal having a frequency that is twice that of the comparison signal.

The phase detector may be useful, for example, in a phase-locked loop in which the comparison signal supplied by the feedback path is only one-half of a desired frequency. This may be the case, for example, where the phase-locked loop has been arranged to compensate for variations in the duty cycle of the signal supplied by the frequency-divider. A phase-locked loop so arranged may comprise, for example, a phase detector that has a reference signal input that receives a reference clock signal and a comparison signal input that receives a comparison signal, wherein the phase detector generates a phase difference signal that represents a phase difference between the reference signal and a signal having twice the frequency of the comparison signal; a circuit that generates a phase-locked loop output signal having a frequency that is a function of the phase difference signal; a frequency divider that receives the phase-locked loop output signal and generates therefrom a divided frequency signal; and a circuit that generates the comparison signal from the divided frequency signal, wherein the comparison signal has one half the frequency of the divided frequency signal.

The circuit that generates the comparison signal may be, for example, a latch device configured to toggle a latch device output state once for each cycle of the divided frequency signal. By responding to only one edge (e.g., a leading or trailing edge) of the divided frequency signal, the output of the latch exhibits a substantially uniform duty cycle.

To compensate for the extra division by two that also results from use of the latch device, the phase detector may then compare a phase of the reference clock signal with a phase of a signal having a frequency that is twice that of the comparison signal.

In some embodiments, the comparison circuit asserts (e.g., by means of a latch device) a first signal having a predetermined logic level in response to only one of a leading edge and a trailing edge of the reference clock signal. The comparison circuit asserts a second signal (e.g., by means of a dual-edge triggered latch) having the predetermined logic level in response to either one of a leading edge and trailing edge of the comparison signal. By being responsive to both the leading and trailing edges of the comparison signal, the original frequency of the signal supplied by the frequency divider is effectively restored. As a consequence, the generated phase difference signal is suitable for causing the phase-locked loop to generate an output signal of a desired frequency.

BRIEF DESCRIPTION OF THE DRAWINGS

The objects and advantages of the invention will be understood by reading the following detailed description in conjunction with the drawings in which.

DETAILED DESCRIPTION

Figure 1:
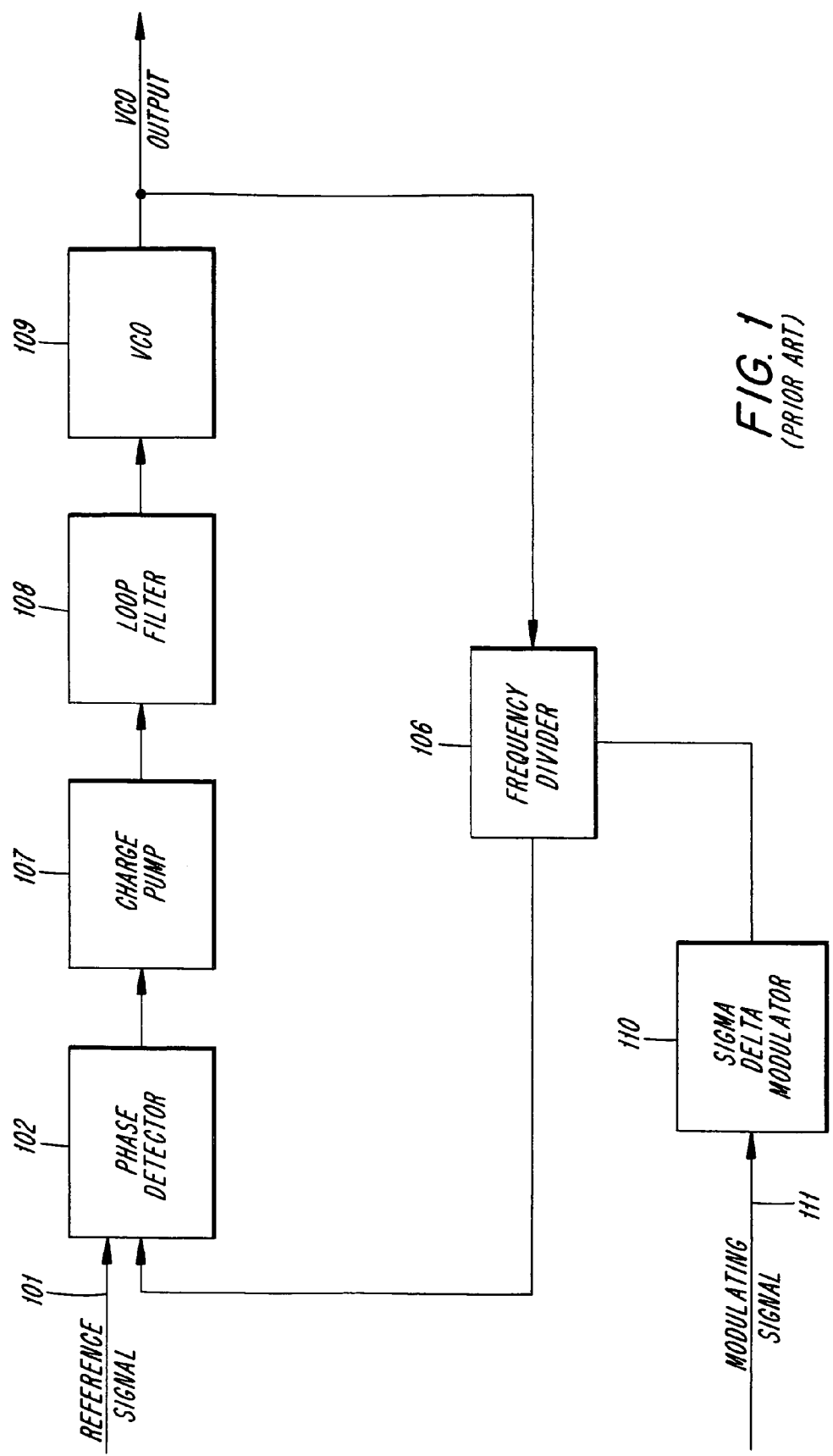
FIG. 1 is a block diagram of a prior art sigma-delta controlled fractional-N PLL modulator.
Figure 2:
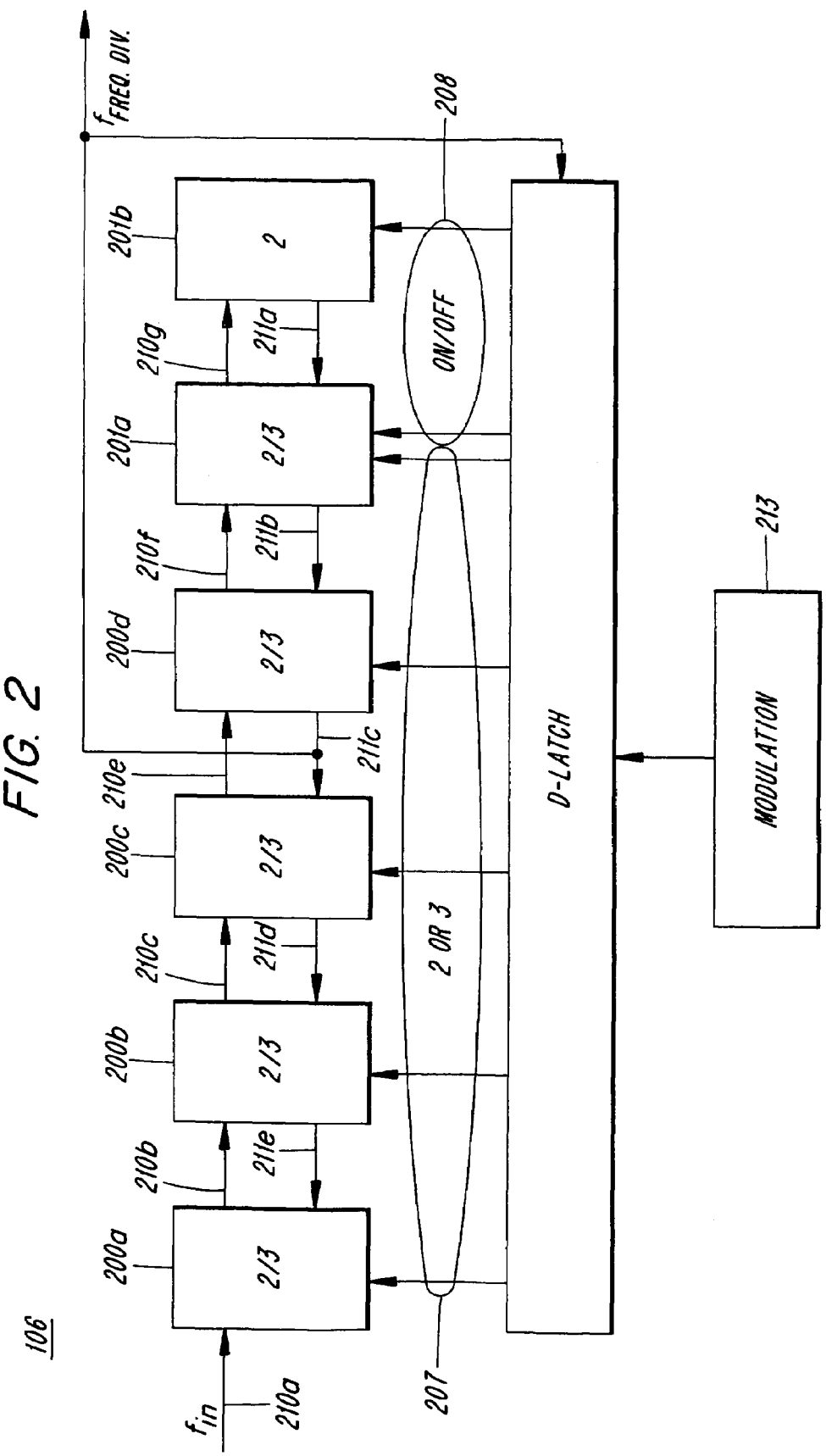
FIG. 2 is a block diagram of an exemplary embodiment of a frequency divider that is implemented in the form of a plurality of series-connected divider blocks.
Figure 3:
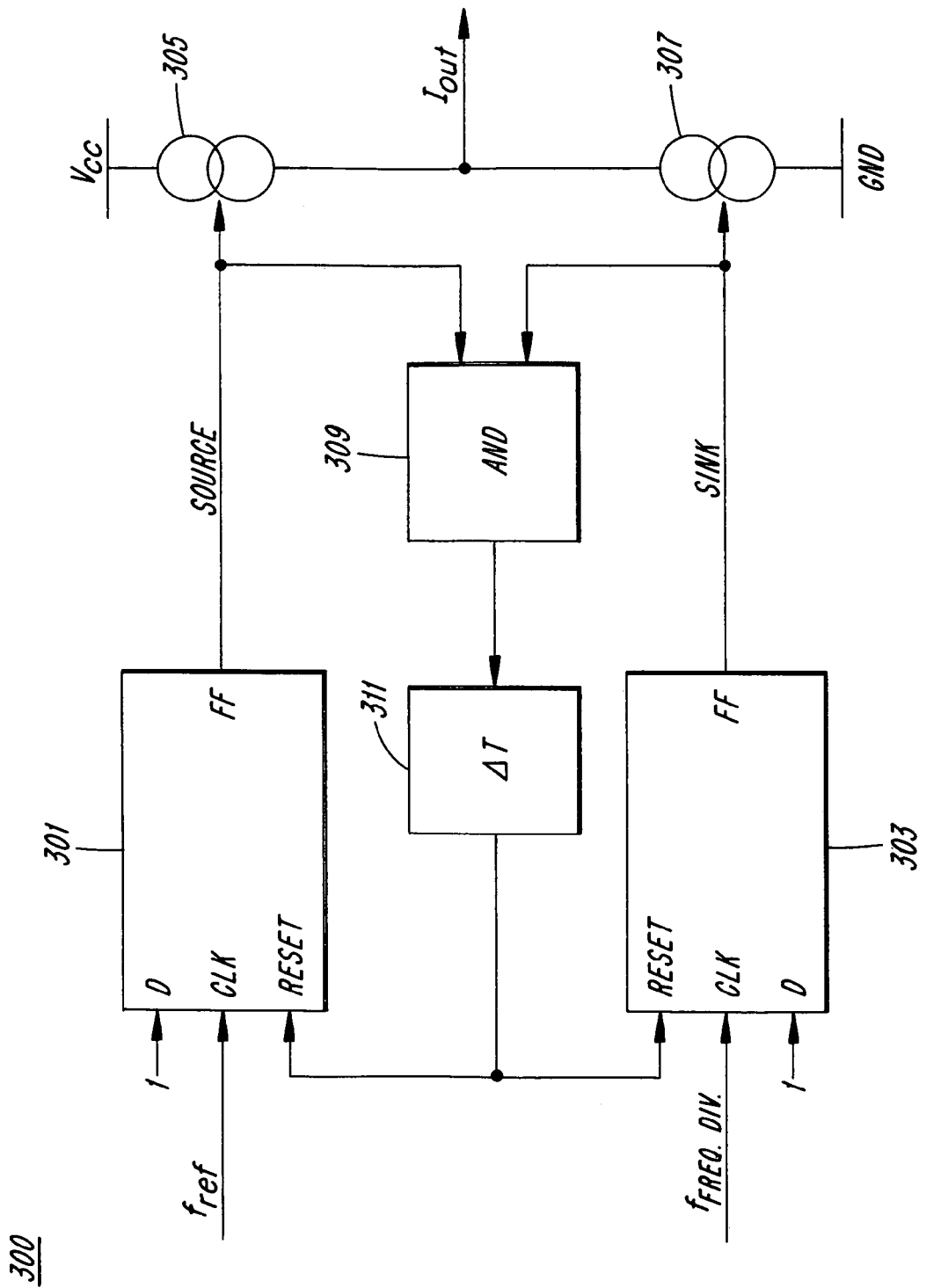
FIG. 3 is a block diagram of a conventional dead-band-free phase detector/charge pump combination.

The various features of the invention will now be described with respect to the figures, in which like parts are identified with the same reference characters.

Figure 5:
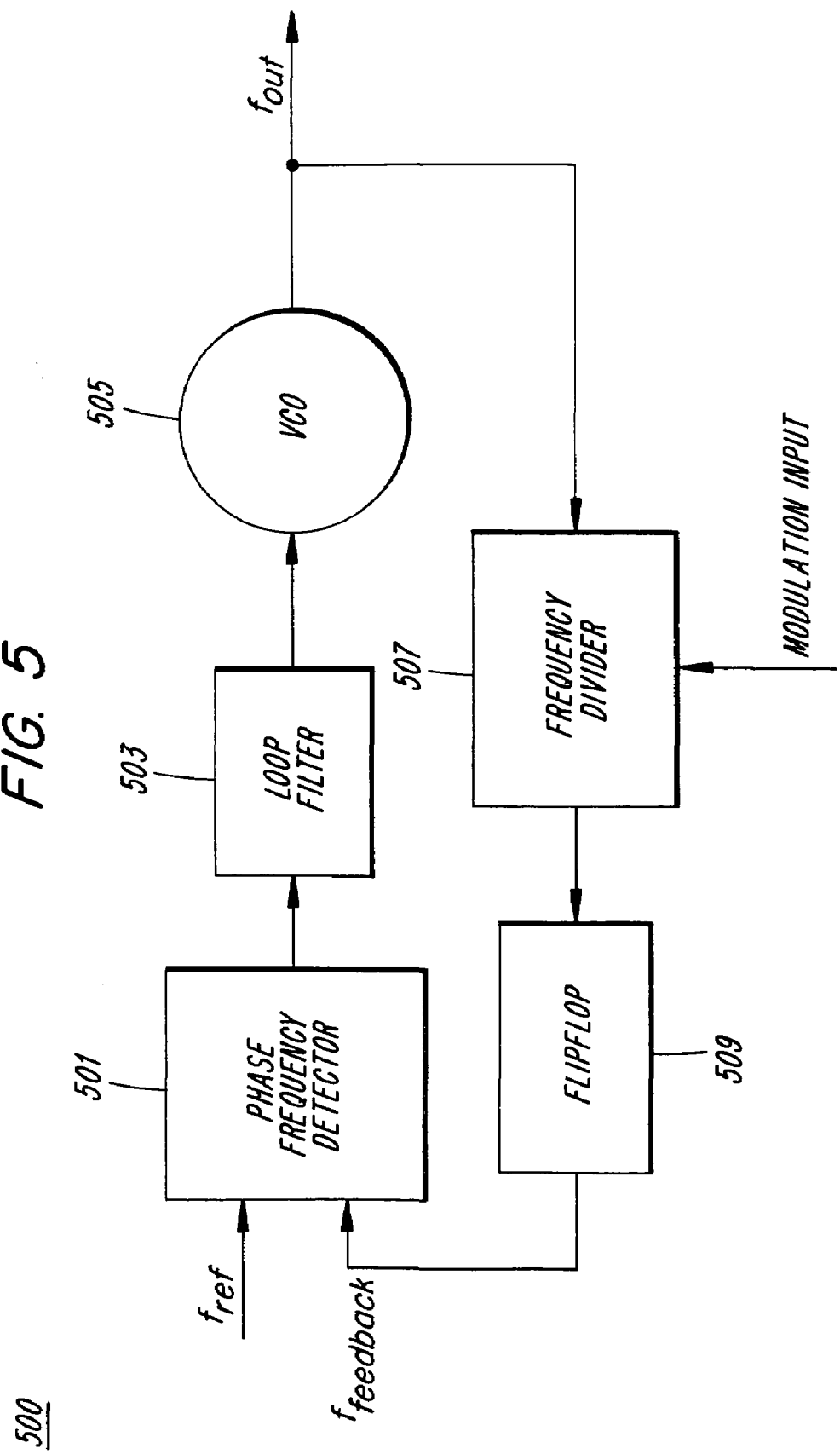
FIG. 5 is a block diagram of a phase locked loop arranged in accordance with an aspect of the invention.

FIG. 5 is a block diagram of a phase locked loop 500 arranged in accordance with the invention. The loop filter 503, VCO 505 and frequency divider 507 operate the same as those described above with reference to FIG. 1, and so need not be described again here in detail. The arrangement of the loop filter and VCO, and other alternative selections of similar arrangements which may or may not include a charge pump, may generally be considered to be a circuit that generates a phase-locked loop output signal having a frequency that is a function of the phase difference signal. The particular arrangement of, and choice of components in, this circuit is not essential to the invention.

A flip-flop 509 configured to perform a toggle function is interposed between the frequency divider 507 and a phase/frequency detector 501. The flip-flop 509 is responsive to the leading edge of the frequency divider output signal, $f_{FREQ.\ DIV.}$. As a result, the output of the flip-flop 509 is a signal having an almost 50 percent duty cycle. That is, the varying duty cycle that characterizes the $f_{FREQ.\ DIV.}$ signal has been substantially eliminated. However, in shaping the signal in this way, its frequency has been divided by two.

If the output signal from the flip-flop 509 were supplied to a conventional phase detector, the resultant PLL output signal would be twice the desired frequency. To compensate for the additional division by two that is performed in the feedback path of the phase-locked-loop 500, the phase/frequency detector 501 is modified so that it compares a phase of the reference clock signal, $f_{ref}$, with a phase of a signal having a frequency that is twice that of the comparison signal, which in this case is the feedback signal, $f_{feedback}$, supplied by the flip-flop 509. In the exemplary embodiment, this is accomplished by having the phase/frequency detector 501 be responsive to both the leading and trailing edges of the flip-flop output signal, $f_{feedback}$.

Figure 6:
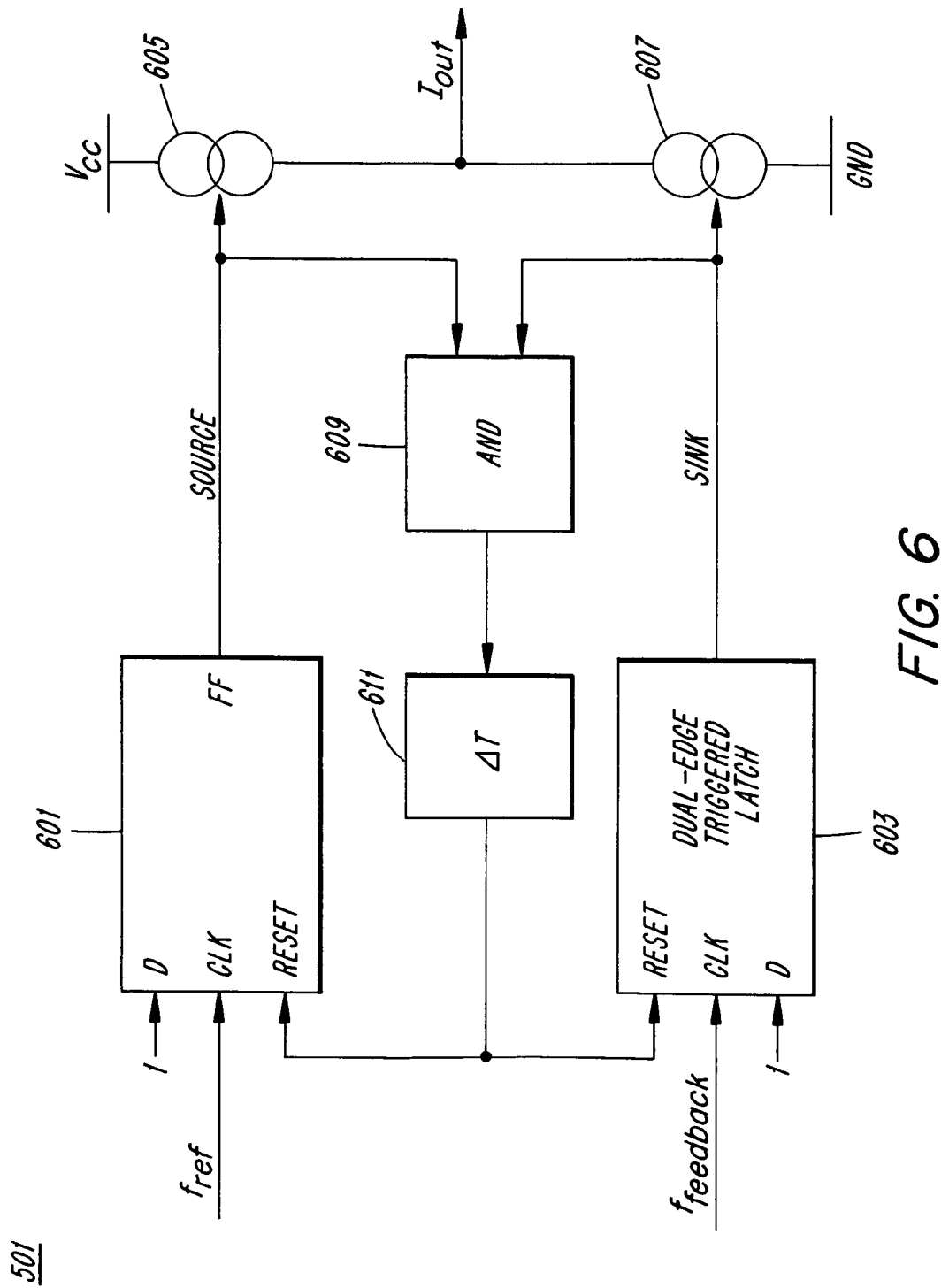
FIG. 6 is a block diagram of an exemplary embodiment of a phase/frequency detector in accordance with an aspect of the invention.

A block diagram of an exemplary embodiment of the phase/frequency detector 501 is illustrated in FIG. 6. This embodiment employs a first flip-flop 601; a dual-edge triggered latch 603; first and second charge pumps 605, 607; a logical AND gate 609; and a delay circuit 611. It is noted that to facilitate an understanding of the invention, the charge pumps 605, 607 are shown as elements of the the phase/frequency detector 501. However, the inclusion of these elements is not essential to the invention. That is, the phase/frequency detector can alternatively be considered to comprise only those components that generate the "source" and "sink" signals that are for use by (possibly) external charge pump(s).

In operation, the first flip-flop 601 controls whether the first charge pump 605 is on or off. Similarly, the dual-edge triggered latch 603 controls whether the second charge pump 607 is on or off. The first and second charge pumps 605, 607 are connected in series, with the phase detector/charge pump output current, $i_{out}$, being supplied at the connection point between the two charge pumps. The amount of phase detector/charge pump output current, $i_{out}$, is related to whether none, one, or both of the first and second charge pumps 605, 607 are turned on. The amount of time that $i_{out}$ is non-zero is a function of the phase difference between the two input signals, $f_{ref}$ and $f_{feedback}$. Each of these signals is supplied to a clock input of a respective one of the first flip-flop 601 and dual-edge triggered latch 603. The first of these signals to present a clocking edge causes the output of the corresponding latch to be asserted, which in turn, causes a corresponding one of the first and second charge pumps 605, 607 to turn on. When the clocking edge of the remaining input signal is subsequently asserted, it too causes the output of its corresponding flip-flop to be asserted. The outputs of both the first flip-flop 601 and dual-edge triggered latch 603 are further supplied to respective inputs of a logical AND gate 609, whose output is supplied to the input of a delay circuit 611, which delays the signal by an amount $\Delta T$ before supplying it to the RESET inputs of both the first flip-flop 601 and dual-edge triggered flip-flop 603. Consequently, when the outputs of both the first flip-flop 601 and the dual-edge triggered latch 603 are asserted, the output of the AND gate 609 will be asserted as well, thereby resetting both the first flip-flop 601 and the dual-edge triggered latch 603 after a period of delay, $\Delta T$. They are now initialized to repeat the process again for a next cycle. As a result, the output current $i_{out}$ is either a positive value (being supplied by the first charge pump 605) if the first input signal $f_{ref}$ leads the second input signal $f_{feedback}$, or else it is a negative value (being drawn by the second charge pump 607) if the second input signal $f_{feedback}$ leads the first input signal $f_{ref}$.

Whereas the first flip-flop 601 triggers on only one edge (e.g., the leading edge) of the supplied input signal $f_{ref}$, the dual-edge triggered latch 603 triggers on either edge (i.e., both the leading and trailing edges) of its supplied input signal, $f_{feedback}$. The dual-edge triggered latch 603 is thus triggered twice in each clock cycle of the supplied input signal, $f_{feedback}$. In effect, therefore, the frequency of the supplied input signal $f_{feedback}$ is doubled, which compensates for the extra division by "2" that is performed by the flip-flop 509 that generates the supplied input signal, $f_{feedback}$. As a result, the output of the phase/frequency detector 501 is appropriate for generating a VCO output having the desired frequency. Moreover, because the supplied input signal, $f_{feedback}$ does not suffer from the varying duty cycle that characterizes the frequency divider output signal ($f_{FREQ.\ DIV.}$), the phase locked loop 500 exhibits improved performance.

Figure 7:
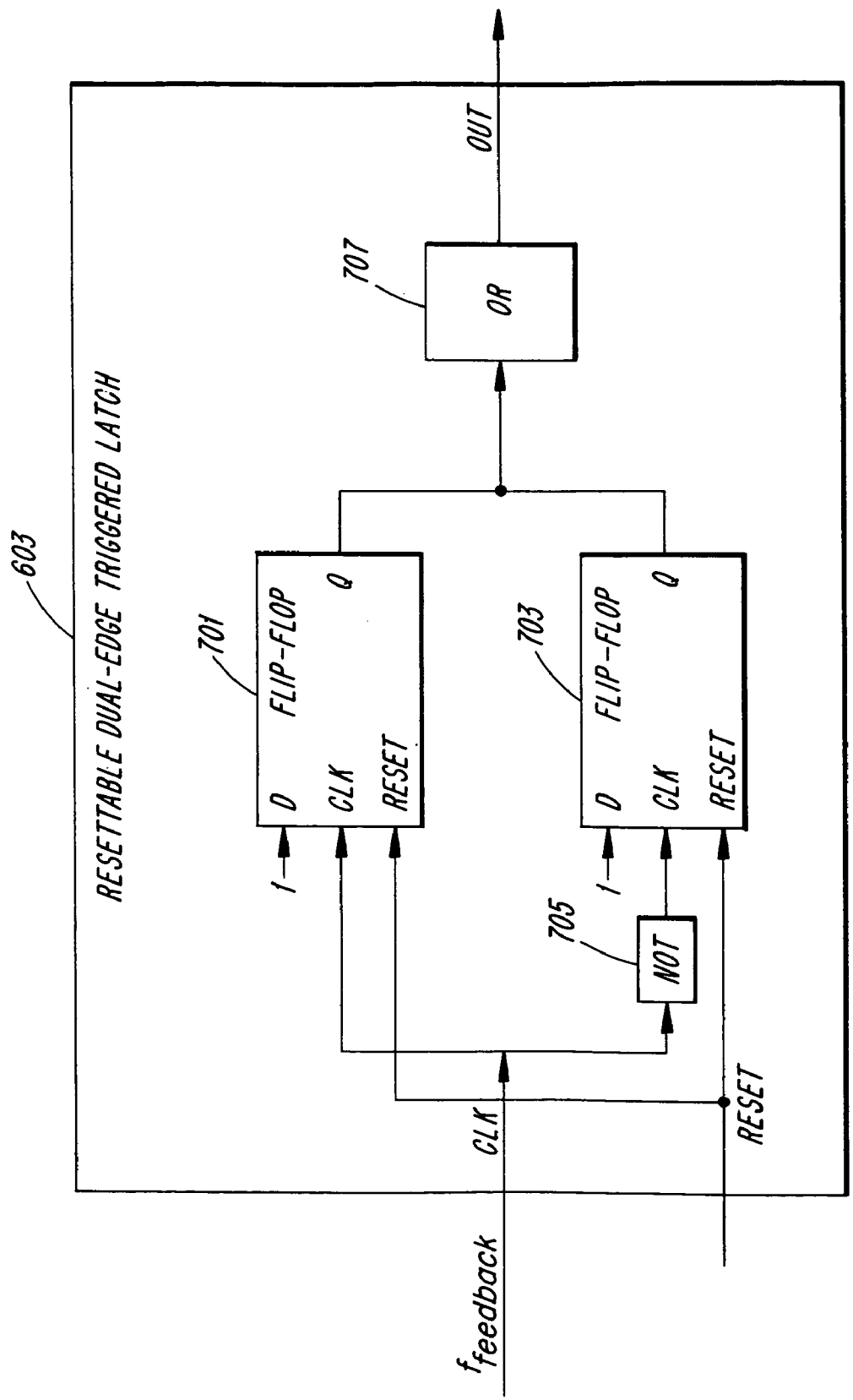
FIG. 7 is a block diagram of an exemplary embodiment of a dual-edge triggered latch.

FIG. 7 is a block diagram of an exemplary embodiment of the dual-edge triggered latch 603. The dual-edge triggered latch 603 includes two D-type flip-flops 701, 703, each of which has a data (D), clock (Clk) and reset (Reset) input terminal, and an output (Q). The data inputs (D) of each of the two flip-flops 701, 703 receives a "high" or "1" input.

The supplied input signal, in this case the supplied input signal $f_{feedback}$, is supplied to the clock input of the first flip-flop 701 and, on each rising edge of the supplied input signal $f_{feedback}$, the flip-flop 701 is triggered to produce a signal on the output (Q) of the device. The supplied input signal $f_{feedback}$ is also supplied to an inverter 705, and the resultant inverted signal, $-f_{feedback}$, is supplied to the clock input of the second flip-flop 703. Thus, this flip-flop triggers on each rising edge of the inverted signal, $-f_{feedback}$, at a time that corresponds to each falling edge of the non-inverted supplied input signal $f_{feedback}$ itself, and produces a signal on the output of this second flip-flop 703. Outputs from these two flip-flops 701, 703 are supplied to a combining circuit, which in this case is a logical OR gate 707, the output of which is supplied as the output from the dual-edge triggered latch 603.

A Reset signal supplied to the dual-edge triggered latch 603 is supplied to the Reset inputs of each of the first and second flip-flops 701, 703. It will be noted that if the Reset signal is asserted in-between the leading and trailing edges of the supplied input signal $f_{feedback}$, then the outputs from each of the first and second flip-flops 701, 703 will be reset to a "low" or "0" state, which in turn causes the signal supplied at the output of the logical OR gate 707 to also go "low" or "0". As a result, the next edge of the supplied input signal $f_{feedback}$ will cause the signal supplied at the output of the logical OR gate 707 to again go "high" or "1", regardless of whether that edge is a leading or trailing edge. As this is the behavior of the Reset signal when the dual-edge triggered flip-flop 603 is employed in the phase detector 501 operating in steady state, the result is that the dual-edge triggered latch 603 generates two clock cycles for every one of the supplied input signal $f_{feedback}$, thereby effectively doubling it.

Figure 4:
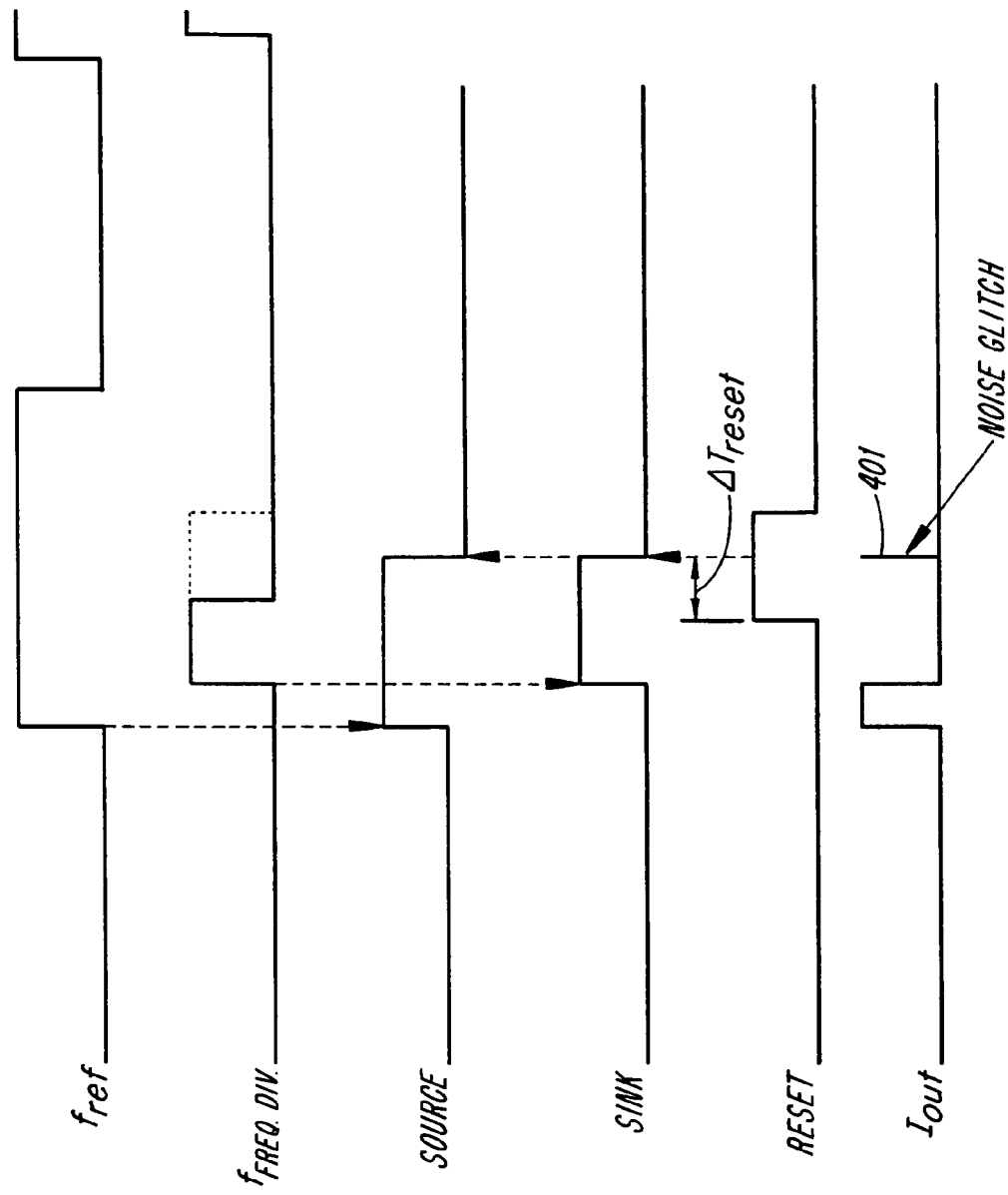
FIG. 4 is a timing diagram of signals generated by the conventional dead-band-free phase detector/charge pump combination.
Figure 8:
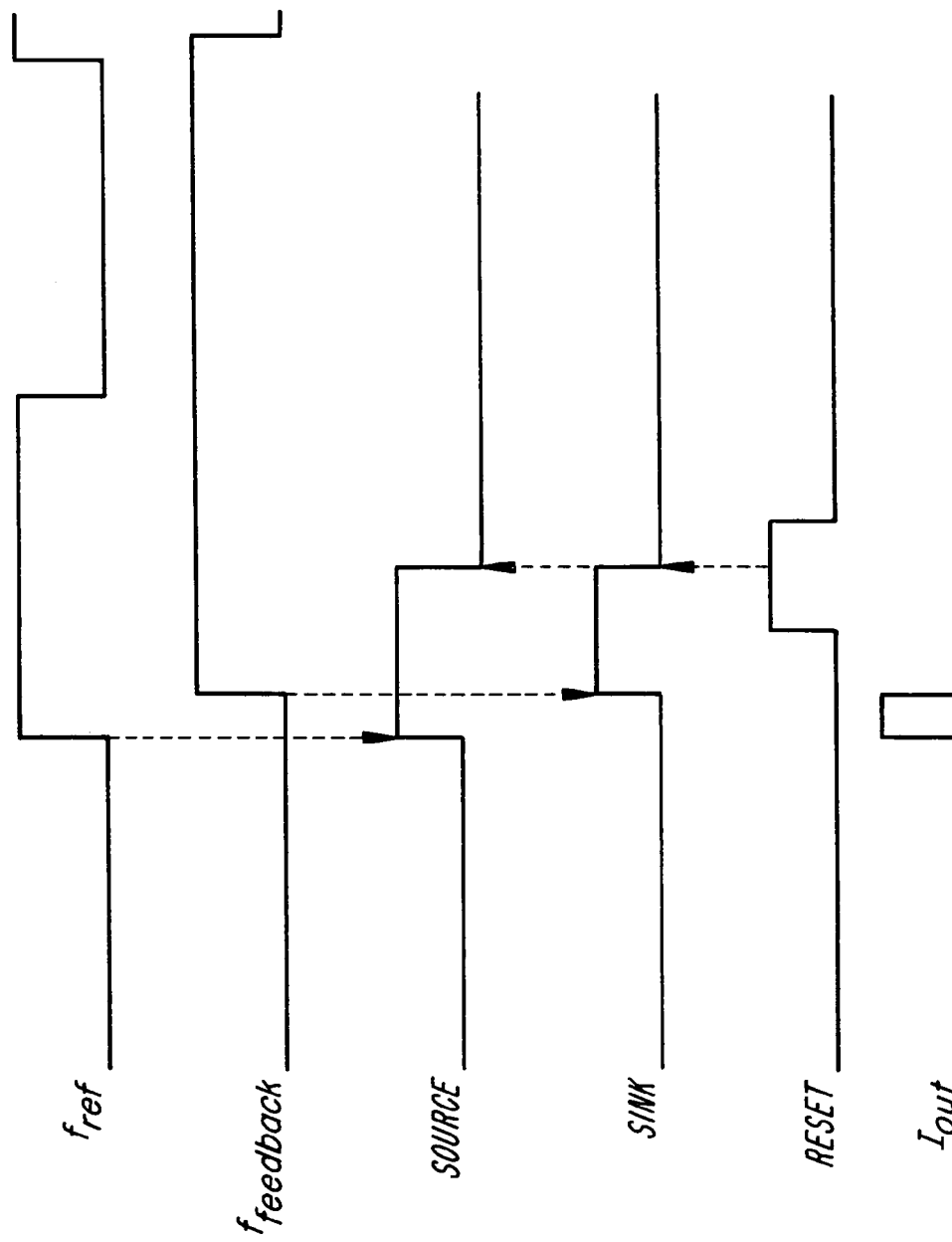
FIG. 8 is a timing diagram of the signals generated within the phase detector, in accordance with an aspect of the invention.

FIG. 8 is a timing diagram of the signals generated within the phase detector 501. In particular, the generated signals associated with only one half the period of the $f_{feedback}$ signal are shown. For the second half of the period, the generated signals would be substantially the same, but with the $f_{feedback}$ signal being low instead of high. It can be seen that the $f_{feedback}$ signal does not suffer from a varying duty cycle. As a result, the varying glitch 401 (see FIG. 4) that characterized the prior art phase detector 300 is replaced by a deterministic one. That is, the $f_{feedback}$ input of the latch 603 will be alternatingly high and low with every new assertion of the reset signal, so that the variation of the input level will not be random. In the prior art phase detector, the glitches appear randomly, as a function of the duty cycle of the comparison frequency (i.e., $f_{FREQ.\ DIV.}$). This randomly introduced glitch in the prior art phase detector causes an increase in total noise performance. By contrast, the inventive phase detector only causes a deterministic glitch, and will therefore not introduce an increased noise performance. A deterministic glitch only causes sidebands (spurious tones) at the reference frequency (e.g., 13 MHZ) offset from the carrier. By this process, not only is the performance of the phase detector 501 improved, but so is that of the PLL 500.

The invention has been described with reference to a particular embodiment. However, it will be readily apparent to those skilled in the art that it is possible to embody the invention in specific forms other than those of the preferred embodiment described above. This may be done without departing from the spirit of the invention.

For example, the various embodiments have illustrated various components being responsive to one of either a leading edge or a trailing edge of various signals. It will be appreciated that alternative embodiments of the invention can be constructed in which for one or more of the components, the roles of the leading and trailing edges are reversed. Also, the illustrated embodiments utilize "high" or "1" signal levels to indicate assertion (e.g., generating a "1" signal level when a predetermined edge of the reference clock signal has been detected). However, alternative embodiments can be devised in which "low" or "0" signal levels are used for this purpose. For example, instead of using a logical AND gate to detect when two signals have both been asserted "high", one might use a logical NOR gate to detect when two signals have both been asserted "low".

The particular logic levels, types of logic gates, and signal edge selections used in any embodiment are not essential to practicing the invention.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A phase-locked loop comprising:
a phase detector that has a reference signal input that receives a reference clock signal and a comparison signal input that receives a comparison signal, wherein the phase detector generates a phase difference signal that represents a phase difference between the reference signal and a signal having twice the frequency of the comparison signal;
a circuit that generates a phase-locked loop output signal having a frequency that is a function of the phase difference signal;
a frequency divider that receives the phase-locked loop output signal and generates therefrom a divided frequency signal; and
a circuit that generates the comparison signal from the divided frequency signal, wherein the comparison signal has one half the frequency of the divided frequency signal, wherein the phase detector comprises:
a comparison circuit that compares a phase of the reference clock signal with a phase of a signal having a frequency that is twice that of the comparison signal.

2. The phase-locked loop of claim 1, wherein the circuit that generates the comparison signal is a latch device configured to toggle a latch device output state once for each cycle of the divided frequency signal.

3. The phase-locked loop of claim 2, wherein the latch device is configured to toggle the latch device output state once for each leading edge of the divided frequency signal.

4. The phase-locked loop of claim 2, wherein the latch device is configured to toggle the latch device output state once for each trailing edge of the divided frequency signal.

5. The phase-locked loop of claim 1, wherein the comparison circuit comprises:
a first circuit that asserts a first signal having a predetermined logic level in response to only one of a leading edge and a trailing edge of the reference clock signal; and
a second circuit that asserts a second signal having the predetermined logic level in response to either one of a leading edge and trailing edge of the comparison signal.

6. The phase-locked loop of claim 5, wherein the comparison circuit further comprises:
a reset circuit that generates a reset signal that resets both the first circuit and the second circuit in response to both the first signal and the second signal being asserted.

7. The phase locked loop of claim 6, wherein the reset circuit comprises a delay circuit that delays generation of the reset signal for a predetermined length of time after both the first signal and the second signal are asserted.

8. The phase-locked loop of claim 5, wherein the second circuit is a dual-edge triggered latch.

9. The phase-locked loop of claim 8, wherein the dual-edge triggered latch comprises:
a first latch device coupled to receive the comparison signal in a way such that the first latch device generates a first latch output signal having a predetermined logic level in response to a leading edge of the comparison signal;
a second latch device coupled to receive the comparison signal in a way such that the second latch device generates a second latch output signal having the predetermined logic level in response to a trailing edge of the comparison signal; and
a combining logic circuit that generates the second signal by combining the first latch output signal and the second latch output signal.

10. The phase-locked loop of claim 9, wherein the combining logic circuit is a logical OR gate.

11. The phase-locked loop of claim 9, wherein the dual-edge triggered latch further comprises:
a reset input for receiving a reset signal that resets both the first latch device and the second latch device.

12. A method of generating a phase-locked loop output signal, comprising:
generating a phase difference signal that represents a phase difference between a reference clock signal and a signal having twice the frequency of a comparison signal by comparing a phase of the reference clock signal with a phase of a signal having a frequency that is twice that of the comparison signal;
generating the phase-locked loop output signal having a frequency that is a function of the phase difference signal;
receiving the phase-locked loop output signal and generating therefrom a divided frequency signal; and
generating the comparison signal from the divided frequency signal, wherein the comparison signal has one half the frequency of the divided frequency signal.

13. The method of claim 12, wherein generating the comparison signal comprises toggling a latch device output state once for each cycle of the divided frequency signal.

14. The method of claim 13, wherein generating the comparison signal comprises toggling the latch device output state once for each leading edge of the divided frequency signal.

15. The method of claim 13, wherein generating the comparison signal comprises toggling the latch device output state once for each trailing edge of the divided frequency signal.

16. The method of claim 12, wherein comparing the phase of the reference clock signal with the phase of the signal having the frequency that is twice that of the comparison signal comprises:
asserting a first signal having a predetermined logic level in response to only one of a leading edge and a trailing edge of the reference clock signal; and
asserting a second signal having the predetermined logic level in response to either one of a leading edge and tailing edge of the comparison signal.

17. The method of claim 16, wherein comparing the phase of the reference clock signal with the phase of the signal having the frequency that is twice that of the comparison signal further comprises:
generating a reset signal that de-asserts both the first signal and the second signal in response to both the first signal and the second signal being asserted.

18. The method of claim 17, wherein generating the reset signal comprises delaying generation of the reset signal for a predetermined length of time after both the first signal and the second signal are asserted.

19. A phase-locked loop comprising:
a phase detector that has a reference signal input that receives a reference clock signal and a comparison signal input that receives a comparison signal, wherein the phase detector generates a phase difference signal that represents a phase difference between the reference signal and a signal generated by the phase detector having twice the frequency of the comparison signal;
a circuit that generates a phase-locked loop output signal having a frequency that is a function of the phase difference signal;
a frequency divider that receives the phase-locked loop output signal and generates therefrom a divided frequency signal; and
a circuit that generates the comparison signal from the divided frequency signal, wherein the comparison signal has one half the frequency of the divided frequency signal.

20. The phase-locked loop of claim 19, wherein the circuit that generates the comparison signal is a latch device configured to toggle a latch device output state once for each cycle of the divided frequency signal.

21. The phase-locked loop of claim 20, wherein the latch device is configured to toggle the latch device output state once for each leading edge of the divided frequency signal.

22. The phase-locked loop of claim 20, wherein the latch device is configured to toggle the latch device output state once for each trailing edge of the divided frequency signal.

23. A method of generating a phase-locked loop output signal, comprising:
generating a phase difference signal from a reference clock signal and a signal having twice the frequency of a comparison signal;
generating the phase-locked loop output signal having a frequency that is a function of the phase difference signal;
receiving the phase-locked loop output signal and generating therefrom a divided frequency signal; and
generating the comparison signal from the divided frequency signal, wherein the comparison signal has one half the frequency of the divided frequency signal.

24. The method of claim 23, wherein generating the comparison signal comprises toggling a latch device output state once for each cycle of the divided frequency signal.

25. The method of claim 24, wherein generating the comparison signal comprises toggling the latch device output state once for each leading edge of the divided frequency signal.

26. The method of claim 24, wherein generating the comparison signal comprises toggling the latch device output state once for each trailing edge of the divided frequency signal.

* * * * *

UNITED STATES PATENT AND TRADEMARK OFFICE
CERTIFICATE OF CORRECTION

PATENT NO. : 6,959,063 B1  Page 1 of 1
APPLICATION NO. : 09/580119
DATED : October 25, 2005
INVENTOR(S) : Leif Magnus Andre Nilsson and Hans Lennart Hagberg It is certified that error appears in the above-identified patent and that said Letters Patent is hereby corrected as shown below:

Col. 10, Line 55
Claim 16, Line 10: Change "tailing" to --trailing--

Signed and Sealed this

Nineteenth Day of December, 2006

JON W. DUDAS
*Director of the United States Patent and Trademark Office*